(12) United States Patent
Lim et al.

(10) Patent No.: US 9,401,185 B1
(45) Date of Patent: Jul. 26, 2016

(54) SENSE AMPLIFIER AND SEMICONDUCTOR DEVICE INCLUDING THE SAME

(71) Applicant: SK hynix Inc., Incheon-si Gyeonggi-do (KR)

(72) Inventors: Kyu Nam Lim, Yongin-si (KR); Woong Ju Jang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/731,759

(22) Filed: Jun. 5, 2015

(30) Foreign Application Priority Data

Jan. 26, 2015 (KR) .................. 10-2015-0012238

(51) Int. Cl.
  *G11C 7/00* (2006.01)
  *G11C 7/06* (2006.01)
  *G11C 7/10* (2006.01)
  *H03K 5/02* (2006.01)

(52) U.S. Cl.
  CPC *G11C 7/065* (2013.01); *G11C 7/10* (2013.01); *H03K 5/02* (2013.01)

(58) Field of Classification Search
  USPC ................... 365/205, 203, 206, 207
  See application file for complete search history.

(56) References Cited

U.S. PATENT DOCUMENTS

| | | | |
|---|---|---|---|
| 5,650,971 A | * 7/1997 | Longway | G11C 7/062 327/51 |
| 6,687,175 B1 | * 2/2004 | Mizuno | G11C 7/04 365/203 |
| 6,930,939 B2 | * 8/2005 | Lim | G11C 7/10 365/190 |
| 8,300,485 B2 | 10/2012 | Lim et al. | |
| 8,559,240 B2 | 10/2013 | Hong et al. | |
| 2010/0091581 A1 | * 4/2010 | Van Winkelhoff | G11C 7/1048 365/189.05 |

* cited by examiner

*Primary Examiner* — Vu Le
(74) *Attorney, Agent, or Firm* — William Park & Associates Ltd.

(57) ABSTRACT

A sense amplifier may include an amplifying section configured to amplify data of a segment line pair when an enable signal is activated and output amplified data to a local line pair, and including latches electrically coupled in a cross-coupled type. The sense amplifier may include a switching section configured to selectively electrically couple the segment line pair and the local line pair in response to an input/output switch signal.

20 Claims, 6 Drawing Sheets

SENSE AMPLIFIER AND SEMICONDUCTOR DEVICE INCLUDING THE SAME

CROSS-REFERENCES TO RELATED APPLICATION

The present application claims priority under 35 U.S.C. §119(a) to Korean Patent Application No. 10-2015-0012238, filed on Jan. 26, 2015, in the Korean Intellectual Property Office, which is incorporated herein by reference in its entirety.

BACKGROUND

1. Technical Field

Various embodiments generally relate to a sense amplifier and a semiconductor device including the same, and more particularly, to a technology relating to a sense amplifier for reading the data of a semiconductor device.

2. Related Art

A semiconductor device includes memory cells and a plurality of data input/output lines for performing data input/output operations on a memory. The data is moved through data input/output lines. The data input/output lines include bit lines, local input/output lines, and global input/output lines. The paths of the data input/output lines used to input and output data are substantially long.

The loads of the data input/output lines electrically interconnected are different from one another. As the chip size of a semiconductor memory device increases, the lengths of data lines playing the role of transmitting data also increase. Accordingly, increases in data transmission delays inevitably occur in the data lines by capacitive loading of the data lines. In an effort to promote smooth data transmission, a semiconductor memory device implements a sense amplifier for amplifying data.

In a semiconductor memory device, data outputted from a memory cell has a substantially fine level of potential. Such a fine signal primarily passes through a bit line sense amplifier, secondarily passes through a local line sense amplifier, is thirdly sensed and amplified by a data input/output line sense amplifier (IOSA), and is discriminated as data of a logic low or a logic high.

Semiconductor memory devices are being developed towards reducing an operation power supply voltage, in consideration of power consumption and reliability. As the operation power supply voltage of the semiconductor memory devices decrease, the potential of a data signal outputted from a memory cell becomes further feeble, and the difference between the potentials of a bit line pair to be applied to the input terminals of a sense amplifier becomes gradually fine.

As a semiconductor memory device trends toward high speed operation, a time during which data lines are activated is shortened. Thus, the difference in the potentials of the bit line pair decreases, whereby a data signal sensing operation becomes further difficult.

SUMMARY

In an embodiment, there may be provided a sense amplifier. The sense amplifier may include an amplifying section configured to amplify data of a segment line pair when an enable signal is activated and output amplified data to a local line pair, and including latches electrically coupled in a cross-coupled type. The sense amplifier may include a switching section configured to selectively electrically couple the segment line pair and the local line pair in response to an input/output switch signal.

In an embodiment, there may be provided a sense amplifier. The sense amplifier may be configured for amplifying data of a local line pair and outputting amplified data to an output line pair when an enable signal is activated. The sense amplifier may include an activation element configured to activate the sense amplifier in response to the enable signal. The sense amplifier may include a pair of transistors configured to be driven by the local line pair. The sense amplifier may include latches configured to amplify the data of the local line pair in response to driving of the pair of transistors, and output the amplified data to the output line pair.

In an embodiment, there may be provided a sense amplifier. The sense amplifier may include an amplifying section configured to amplify data of a local line pair when an enable signal is activated and output amplified data to an output line pair, and may include latches electrically coupled in a cross-coupled type. The sense amplifier may include a switching section configured to selectively electrically couple the local line pair and the output line pair in response to an input/output switch signal.

In an embodiment, there may be provided a semiconductor device. The semiconductor device may include a local sense amplifier configured to amplify data of a segment line pair when a first enable signal is activated and output amplified data to a local line pair, and may include latches electrically coupled in a cross-coupled type. The semiconductor device may include a switching section configured to selectively electrically couple the segment line pair and the local line pair in response to an input/output switch signal. The semiconductor device may include an input/output sense amplifier configured to amplify data of the local line pair when a second enable signal is activated and output amplified data to an output line pair.

DETAILED DESCRIPTION

Hereinafter, a sense amplifier and a semiconductor device including the same will be described below with reference to the accompanying drawings through various examples of embodiments.

Various embodiments may be directed to improving the structure of a sense amplifier, thereby increasing a read operation speed and reducing current consumption.

Figure 1:
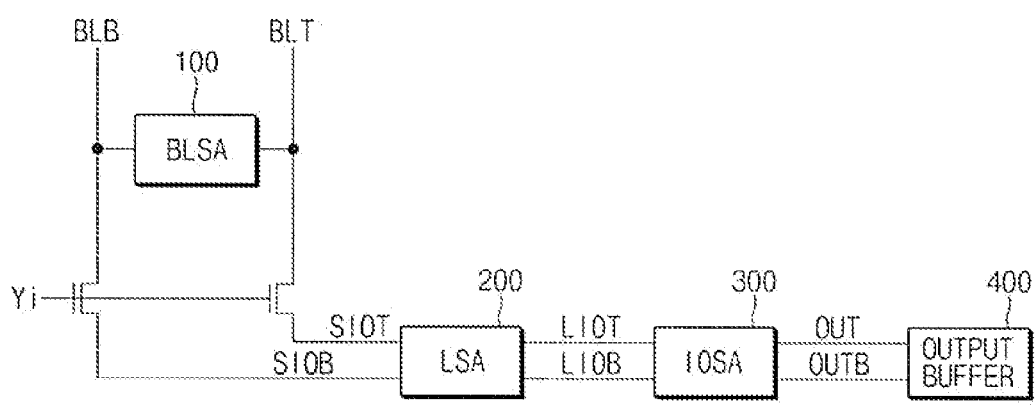
FIG. 1 is a configuration diagram illustrating a representation of an example of a semiconductor device in accordance with an embodiment.

FIG. 1 is a configuration diagram illustrating a representation of an example of a semiconductor device in accordance with an embodiment.

The semiconductor device in accordance with an embodiment may include a bit line sense amplifier (BLSA) 100, and a local sense amplifier (LSA) 200. The embodiment may include an input/output sense amplifier (IOSA) 300, and an output buffer 400.

As an address is applied to the semiconductor device from, for example, a controller, a corresponding word line (not illustrated) is enabled. Accordingly, the data stored in a memory cell (not illustrated) may be loaded on a bit line pair BLT and BLB.

The bit line sense amplifier 100 may amplify a voltage corresponding to the charges stored in the memory cell. The data amplified by the bit line sense amplifier 100 may be transferred to a segment line pair SIOT and SIOB as a column select signal Yi is enabled.

The local sense amplifier 200 may amplify the data loaded on the segment line pair SIOT and SIOB, and may provide the amplified data to the input/output sense amplifier 300 through a local line pair LIOT and LIOB. The input/output sense amplifier 300 may amplify the data provided thereto, and may transmit output signals OUT and OUTB to global input/output lines such that the output signals OUT and OUTB may be outputted through the output buffer 400 to an exterior.

The output buffer 400 may be activated according to the control of an output enable signal, and may output data to the exterior. When data is inputted, a data input path is opposite to the data output path described above.

For example, in a semiconductor memory device, in particular, a DRAM, a path, in which a signal amplified by the bit line sense amplifier 100 is loaded on the segment line pair SIOT and SIOB through column selection from a bit line, is amplified again by the local sense amplifier 200 and the input/output sense amplifier 300, and then reaches the output buffer 400, is referred to as a read path.

Figure 2:
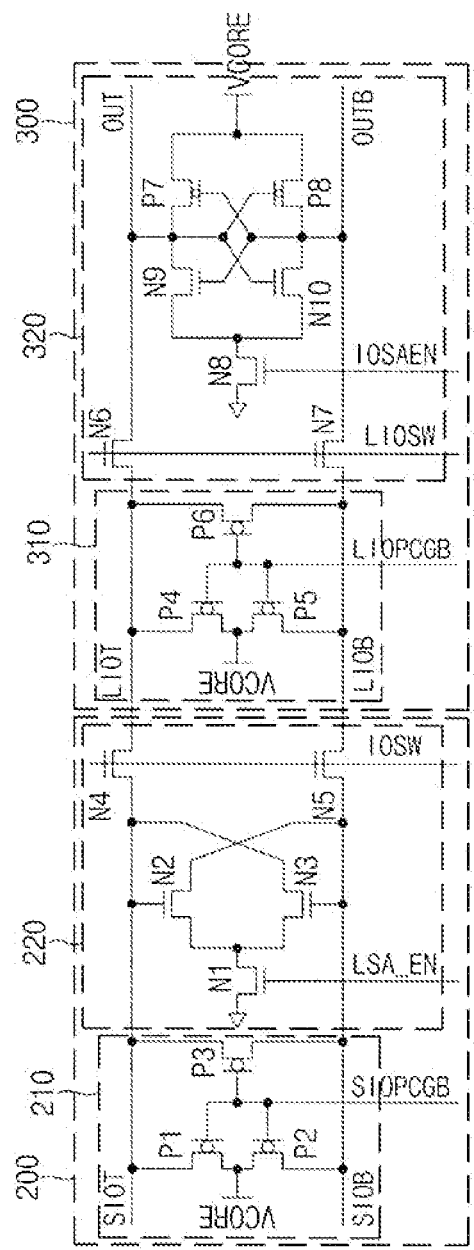
FIG. 2 is a circuit diagram illustrating representations of examples of the local sense amplifier and the input/output sense amplifier illustrated in FIG. 1.

FIG. 2 is a circuit diagram illustrating representations of examples of the local sense amplifier 200 and the input/output sense amplifier 300 illustrated in FIG. 1.

First, the local sense amplifier 200 may include a precharge unit 210 and a sense amplifier 220.

The precharge unit 210 may precharge the segment line pair SIOT and SIOB in response to a precharge signal SIOPCGB. The precharge unit 210 may provide a core voltage VCORE to the segment line pair SIOT and SIOB in response to the precharge signal SIOPCGB. For example, the segment line pair SIOT and SIOB may be precharged to the level of the core voltage VCORE. The core voltage VCORE may be an internal voltage used in the memory bank and the peripheral circuit block of the semiconductor device.

The precharge signal SIOPCGB may be a signal generated from an internal precharge signal and may be generated in the example where the semiconductor device receives an active command from the exterior (or the controller), similarly to an input/output switch signal IOSW. The precharge signal SIOPCGB may be a signal deactivated in the example where the semiconductor device receives a read or write command from the exterior (or the controller) and an internal read signal or an internal write signal is generated.

Such a precharge unit 210 may include a plurality of PMOS transistors. For example, the precharge unit 210 may include PMOS transistors P1 to P3. The PMOS transistors P1 to P3 may receive the precharge signal SIOPCGB through the common gate terminal thereof. The PMOS transistors P1 and P2 are electrically coupled in series between the segment line pair SIOT and SIOB, and are applied with the core voltage VCORE through the common drain terminal thereof. The PMOS transistor P3 is electrically coupled between the segment line pair SIOT and SIOB.

The precharge unit 210 may provide the core voltage VCORE to the segment line pair SIOT and SIOB when, for example, the precharge signal SIOPCGB is enabled, and may precharge the segment line pair SIOT and SIOB.

The sense amplifier 220 may include an amplifying section and a switching section.

The amplifying section may include a plurality of NMOS transistors. For example the amplifying section may include NMOS transistors N1 to N3 to amplify the data loaded on the segment line pair SIOT and SIOB. The switching section may include, for example, NMOS transistors N4 and N5 to electrically couple or decouple the segment line pair SIOT and SIOB and the local line pair LIOT and LIOB.

The NMOS transistor N1 is an activation element electrically coupled between the common coupling terminal of the NMOS transistors N2 and N3 and a ground voltage terminal. The NMOS transistor N1 is applied with an enable signal LSA_EN through the gate terminal thereof. The enable signal LSA_EN is an activation signal allowing the sense amplifier 220 to differentially amplify the segment line pair SIOT and SIOB. The NMOS transistor N1 is turned on by the enable signal LSA_EN, and allows current to be discharged to the ground voltage terminal.

The enable signal LSA_EN may also be generated from the internal read signal. The internal read signal is a signal generated internally when the read command is applied from the exterior (or the controller) to allow the semiconductor device to perform a read operation. For example, the enable signal LSA_EN may be generated from the internal read signal or an internal sense amplifier enable signal. In the example where the semiconductor device receives the read or write command to perform the read or write operation, the internal read signal or the internal write signal is generated internally of the semiconductor device, and the internal sense amplifier enable signal is generated from the internal read or write signal.

The NMOS transistors N2 and N3 may correspond to NMOS latches electrically coupled in a cross-coupled type between the drain terminal of the NMOS transistor N1 and the segment line pair SIOT and SIOB. For example, the NMOS transistor N2 is electrically coupled between the segment line SIOB and the drain terminal of the NMOS transistor N1, and the gate terminal of the NMOS transistor N2 is electrically coupled with the segment line SIOT. The NMOS transistor N3 is electrically coupled between the segment line SIOT and the drain terminal of the NMOS transistor N1, and the gate terminal of the NMOS transistor N3 is electrically coupled with the segment line SIOB.

In the read operation, if, for example, the enable signal LSA_EN is activated, the NMOS transistor N1 is turned on. The NMOS transistors N2 and N3 may be complementarily turned on according to the data levels of the segment line pair SIOT and SIOB, and may differentially amplify the data of the segment line pair SIOT and SIOB.

In an embodiment, the amplifying section may be constructed by the two NMOS transistors N2 and N3. For example, since the number of the transistors of the amplifying section may be decreased when compared to the conventional art, it may be possible to use the NMOS transistors N2 and N3 having relatively large driving capabilities (for example, two times larger width of the active regions of transistors than the conventional art). As a consequence, a mismatch in the threshold voltages of the NMOS transistors N2 and N3 may be decreased.

In this example, the layout area of the local sense amplifier 200 may be decreased, and an offset may be decreased. In an embodiment, the circuit of the amplifying section of the local sense amplifier 200 may be simplified, whereby a tRCD (RAS to CAS delay time) characteristic and a tAA (address access delay time) characteristic may be improved and scramble control of cell data may be simplified.

The NMOS transistor N4 may be electrically coupled between the segment line SIOT and the local line LIOT, and may be applied with the input/output switch signal IOSW through the gate terminal thereof. The NMOS transistor N5 may be electrically coupled between the segment line SIOB and the local line LIOB, and may be applied with the input/output switch signal IOSW through the gate terminal thereof.

Such a switching section (the NMOS transistors N4 and N5) electrically couple or decouple the segment line pair SIOT and SIOB and the local line pair LIOT and LIOB in response to the input/output switch signal IOSW.

In an embodiment, the input/output switch signal IOSW, as a signal for selecting the local line pair LIOT and LIOB, may be generated from an active signal and a row selection signal. The active signal may be a signal generated in response to an active command from the exterior (or the controller), to allow the semiconductor device to be activated to perform the read or write operation while being in a precharged state. The row selection signal, as a signal for selecting a row of a memory block of the semiconductor device, may correspond to, for example, a signal for selecting a word line.

The switching section, for example, (NMOS transistors N4 and N5) electrically couples the segment line pair SIOT and SIOB and the local line pair LIOT and LIOB in response to the input/output switch signal IOSW. For example, the switching section allows the segment line pair SIOT and SIOB to be continuously electrically coupled with the local line pair LIOT and LIOB while the semiconductor device performs an active operation.

The local sense amplifier 200 may have a structure capable of separately performing the write operation and the read operation. For example, in the write operation, the local sense amplifier 200 electrically couples the segment line pair SIOT and SIOB and the local line pair LIOT and LIOB such that data transmission is implemented. In the read operation, the local sense amplifier 200 electrically decouples the segment line pair SIOT and SIOB and the local line pair LIOT and LIOB such that the differential amplified signals loaded on the segment line pair SIOT and SIOB are transmitted to the local line pair LIOT and LIOB.

The input/output sense amplifier 300 may include a precharge unit 310 and a sense amplifier 320.

The precharge unit 310 may precharge the local line pair LIOT and LIOB in response to a precharge signal LIOPCGB. The precharge unit 310 may provide the core voltage VCORE to the local line pair LIOT and LIOB in response to the precharge signal LIOPCGB such that the local line pair LIOT and LIOB may be precharged to the level of the core voltage VCORE.

For example, the precharge unit 310 may include a plurality of PMOS transistors P4 to P6. The PMOS transistors P4 to P6 receive the precharge signal LIOPCGB through the common gate terminal thereof. The PMOS transistors P4 and P5 may be electrically coupled in series between the local line pair LIOT and LIOB, and may be applied with the core voltage VCORE through the common drain terminal thereof.

The PMOS transistor P6 may be electrically coupled between the local line pair LIOT and LIOB.

The precharge unit 310 may provide the core voltage VCORE to the local line pair LIOT and LIOB when, for example, the precharge signal LIOPCGB is enabled, and precharges the local line pair LIOT and LIOB.

The sense amplifier 320 may include an amplifying section and a switching section.

The amplifying section may include a plurality of NMOS transistors and PMOS transistors. For example, the amplifying section may include NMOS transistors N8 to N10 and PMOS transistors P7 and P8 to amplify the data loaded on the local line pair LIOT and LIOB. The switching section may include NMOS transistors N6 and N7 to electrically couple or decouple the local line pair LIOT and LIOB and an output line pair OUT and OUTB.

The NMOS transistor N8 may be an activation element electrically coupled between the common coupling terminal of the NMOS transistors N9 and N10 and the ground voltage terminal. The NMOS transistor N8 may be applied with an enable signal IOSAEN through the gate terminal thereof. The enable signal IOSAEN may be an activation signal allowing for the sense amplifier 320 to differentially amplify the local line pair LIOT and LIOB. The NMOS transistor N8 may be turned on by the enable signal IOSAEN, and may allow the current to be discharged to the ground voltage terminal.

The NMOS transistors N9 and N10 and the PMOS transistors P7 and P8 may be latches electrically coupled in a cross-coupled type. For example, the gate terminals of the NMOS transistor N9 and the PMOS transistor P7 are commonly electrically coupled, and are electrically coupled with the output line OUTB. For example, the gate terminals of the NMOS transistor N10 and the PMOS transistor P8 are commonly electrically coupled, and are electrically coupled with the output line OUT.

For example, in the read operation, if the enable signal IOSAEN is activated, the NMOS transistor N8 is turned on. The NMOS transistors N9 and N10 and the PMOS transistors P7 and P8 latch and amplify the data of the local line pair LIOT and LIOB, and output the latched and amplified data to the output line pair OUT and OUTB.

The NMOS transistor N6 may be electrically coupled between the local line LIOT and the output line OUT, and may be applied with an input/output switch signal LIOSW through the gate terminal thereof. The NMOS transistor N7 may be electrically coupled between the local line LIOB and the output line OUTB, and may be applied with the input/output switch signal LIOSW through the gate terminal thereof.

For example, a switching section (the NMOS transistors N6 and N7) may electrically couple or decouple the local line pair LIOT and LIOB and the output line pair OUT and OUTB in response to the input/output switch signal LIOSW. The switching section may allow the local line pair LIOT and LIOB to be continuously electrically coupled with the output line pair OUT and OUTB while the semiconductor device performs an active operation.

The input/output sense amplifier 300 may have a structure capable of separately performing the write operation and the read operation. For example, in the read operation, the input/output sense amplifier 300 electrically decouples the local line pair LIOT and LIOB and the output line pair OUT and OUTB such that the amplified signals loaded on the local line pair LIOT and LIOB may be transmitted to the output line pair OUT and OUTB.

Figure 3:
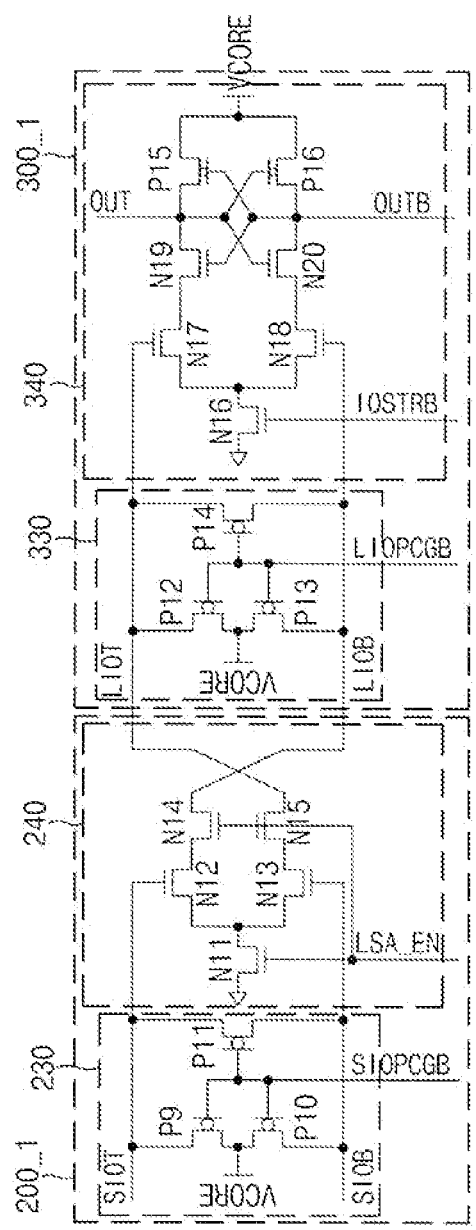
FIG. 3 is a circuit diagram illustrating representations of other examples of the local sense amplifier and the input/output sense amplifier of FIG. 1.

FIG. 3 is a circuit diagram illustrating representations of examples of a local sense amplifier 200_1 and an input/output sense amplifier 300_1.

The local sense amplifier 200_1 may include a precharge unit 230 and a sense amplifier 240.

The precharge unit 230 may precharge a segment line pair SIOT and SIOB in response to a precharge signal SIOPCGB. The precharge unit 230 may provide a core voltage VCORE to the segment line pair SIOT and SIOB in response to the precharge signal SIOPCGB such that the segment line pair SIOT and SIOB may be precharged to the level of the core voltage VCORE.

For example, a precharge unit 230 may include a plurality of PMOS transistors P9 to P11. The PMOS transistors P9 to P11 may receive the precharge signal SIOPCGB through the common gate terminal thereof. The PMOS transistors P9 and P10 may be electrically coupled in series between the segment line pair SIOT and SIOB, and may be applied with the core voltage VCORE through the common drain terminal thereof. The PMOS transistor P11 may be electrically coupled between the segment line pair SIOT and SIOB.

The precharge unit 230 may provide the core voltage VCORE to the segment line pair SIOT and SIOB when, for example the precharge signal SIOPCGB is enabled, and may precharge the segment line pair SIOT and SIOB.

The sense amplifier 240 may include a plurality of NMOS transistors N11 to N15 to amplify the data loaded on the segment line pair SIOT and SIOB. The NMOS transistor N11 may be an activation element electrically coupled between the common coupling terminal of the NMOS transistors N12 and N13 and a ground voltage terminal. The NMOS transistor N11 may be applied with an enable signal LSA_EN through the gate terminal thereof. The enable signal LSA_EN may be an activation signal allowing the sense amplifier 240 to differentially amplify the segment line pair SIOT and SIOB. The NMOS transistor N11 may be turned on by the enable signal LSA_EN, and may allow current to be discharged to the ground voltage terminal.

The NMOS transistors N12 and N13 may be electrically coupled between the drain terminal of the NMOS transistor N11 and the NMOS transistors N14 and N15. The gate terminal of the NMOS transistor N12 may be electrically coupled with the segment line SIOT. The gate terminal of the NMOS transistor N13 may be electrically coupled with the segment line SIOB.

The NMOS transistors N14 and N15 correspond to NMOS latches electrically coupled in a cross-coupled type between the NMOS transistors N12 and N13 and a local line pair LIOT and LIOB. The NMOS transistors N14 and N15 may be applied with the enable signal LSA_EN through the common gate terminal thereof. The NMOS transistor N14 may be electrically coupled between the local line LIOB and the drain terminal of the NMOS transistor N12. The NMOS transistor N15 may be electrically coupled between the local line LIOT and the drain terminal of the NMOS transistor N13.

In a read operation, if the enable signal LSA_EN is activated for example, the NMOS transistors N11, N14 and N15 are turned on. The NMOS transistors N12 and N13 may be complementarily turned on according to the data levels of the segment line pair SIOT and SIOB, and may differentially amplify the data of the segment line pair SIOT and SIOB. If the NMOS transistors N14 and N15 are turned on for example, the data amplified by the NMOS transistors N12 and N13 are transferred to the local line pair LIOT and LIOB.

The input/output sense amplifier 300_1 may include a precharge unit 330 and a sense amplifier 340.

The precharge unit 330 may precharge the local line pair LIOT and LIOB in response to a precharge signal LIOPCGB. The precharge unit 330 may provide the core voltage VCORE to the local line pair LIOT and LIOB in response to the precharge signal LIOPCGB such that the local line pair LIOT and LIOB may be precharged to the level of the core voltage VCORE.

For example, a precharge unit 330 may include a plurality of PMOS transistors P12 to P14. The PMOS transistors P12 to P14 may receive the precharge signal LIOPCGB through the common gate terminal thereof. The PMOS transistors P12 and P13 may be electrically coupled in series between the local line pair LIOT and LIOB, and may be applied with the core voltage VCORE through the common drain terminal thereof. The PMOS transistor P14 may be electrically coupled between the local line pair LIOT and LIOB.

The precharge unit 330 may provide the core voltage VCORE to the local line pair LIOT and LIOB when, for example, the precharge signal LIOPCGB is enabled, and may precharge the local line pair LIOT and LIOB.

The sense amplifier 340 may include a plurality of NMOS transistors and PMOS transistors. For example, the sense amplifier 340 may include NMOS transistors N16 to N20 and PMOS transistors P15 and P16 to amplify the data loaded on the local line pair LIOT and LIOB. The NMOS transistor N16 may be an activation element electrically coupled between the common coupling terminal of the NMOS transistors N17 and N18 and the ground voltage terminal. The NMOS transistor N16 may be applied with an enable signal IOSTRB through the gate terminal thereof. The enable signal IOSTRB may be an activation signal allowing the sense amplifier 340 to differentially amplify the local line pair LIOT and LIOB. The NMOS transistor N16 may be turned on by the enable signal IOSTRB, and may allow current to be discharged to the ground voltage terminal.

The NMOS transistors N17 and N18 may be electrically coupled between the NMOS transistor N16 and the NMOS transistors N19 and N20. The NMOS transistor N17 may have the gate terminal electrically coupled with the local line LIOT. The NMOS transistor N18 may have the gate terminal electrically coupled with the local line LIOB.

The NMOS transistors N19 and N20 and the PMOS transistors P15 and P16 may be latches electrically coupled in a cross-coupled type. For example, the gate terminals of the NMOS transistor N19 and the PMOS transistor P15 may be commonly electrically coupled, and may be electrically coupled with an output line OUTB. The gate terminals of the NMOS transistor N20 and the PMOS transistor P16 may be commonly electrically coupled, and may be electrically coupled with an output line OUT.

In the read operation, if the enable signal IOSTRB is activated, the NMOS transistor N16 may be turned on. If the NMOS transistors N17 and N18 are turned on by the local line pair LIOT and LIOB, the amplifying operations of the NMOS transistors N19 and N20 and the PMOS transistors P15 and P16 may be started. The NMOS transistors N19 and N20 and the PMOS transistors P15 and P16 may latch and amplify the data of the local line pair LIOT and LIOB, and may output the latched and amplified data to the output line pair OUT and OUTB.

In an embodiment, the sense amplifier 340 may include NMOS transistors N17 and N18. As the precharge units 230 and 330 are driven to the level of the core voltage VCORE, driving current increases. For example, in an embodiment, the driving capability of the sense amplifier 340 may be improved and an operation speed may be increased, whereby a tRCD (RAS to CAS delay time) characteristic and a tAA (address access delay time) characteristic may be improved.

Figure 4:
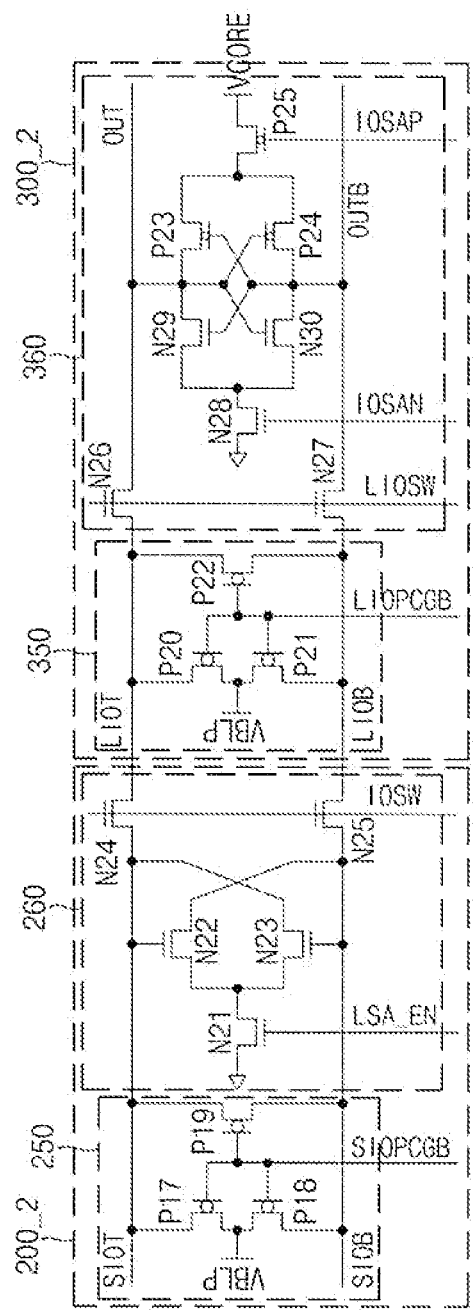
FIG. 4 is a circuit diagram illustrating representations of still other examples of the local sense amplifier and the input/output sense amplifier of FIG. 1.

FIG. 4 is a circuit diagram illustrating representations of examples of a local sense amplifier 200_2 and an input/output sense amplifier 300_2.

For example, the local sense amplifier 200_2 may include a precharge unit 250 and a sense amplifier 260.

The precharge unit 250 may precharge a segment line pair SIOT and SIOB in response to a precharge signal SIOPCGB. The precharge unit 250 may provide a bit line precharge voltage VBLP to the segment line pair SIOT and SIOB in response to the precharge signal SIOPCGB such that the segment line pair SIOT and SIOB may be precharged to the level of the bit line precharge voltage VBLP. The bit line precharge voltage VBLP may be set to one half level of a core voltage VCORE.

For example, a precharge unit 250 may include a plurality of PMOS transistors P17 to P19. The PMOS transistors P17 to P19 may receive the precharge signal SIOPCGB through the common gate terminal thereof. The PMOS transistors P17 and P18 may be electrically coupled in series between the segment line pair SIOT and SIOB, and may be applied with the bit line precharge voltage VBLP through the common drain terminal thereof. The PMOS transistor P19 may be electrically coupled between the segment line pair SIOT and SIOB.

The precharge unit 250 may provide the bit line precharge voltage VBLP to the segment line pair SIOT and SIOB when, for example, the precharge signal SIOPCGB is enabled, and may precharge the segment line pair SIOT and SIOB.

The sense amplifier 260 may include an amplifying section and a switching section.

The amplifying section may include a plurality of NMOS transistors. The amplifying section, for example, may include NMOS transistors N21 to N23 to amplify the data loaded on the segment line pair SIOT and SIOB. The switching section may include, for example, NMOS transistors N24 and N25 to electrically couple or decouple the segment line pair SIOT and SIOB and a local line pair LIOT and LIOB.

The NMOS transistor N21 may be an activation element electrically coupled between the common coupling terminal of the NMOS transistors N22 and N23 and a ground voltage terminal and may be applied with an enable signal LSA_EN through the gate terminal thereof. The enable signal LSA_EN may be an activation signal allowing the sense amplifier 260 to differentially amplify the segment line pair SIOT and SIOB. The NMOS transistor N21 may be turned on by the enable signal LSA_EN, and may allow current to be discharged to the ground voltage terminal.

The NMOS transistors N22 and N23 correspond to NMOS latches electrically coupled in a cross-coupled type between the drain terminal of the NMOS transistor N21 and the segment line pair SIOT and SIOB. For example, the NMOS transistor N22 is electrically coupled between the segment line SIOB and the drain terminal of the NMOS transistor N21, and the gate terminal of the NMOS transistor N22 is electrically coupled with the segment line SIOT. The NMOS transistor N23 may be electrically coupled between the segment line SIOT and the drain terminal of the NMOS transistor N21, and the gate terminal of the NMOS transistor N23 may be electrically coupled with the segment line SIOB.

In a read operation for example, if the enable signal LSA_EN is activated, the NMOS transistor N21 is turned on. The NMOS transistors N22 and N23 may be complementarily turned on according to the data levels of the segment line pair SIOT and SIOB, and may differentially amplify the data of the segment line pair SIOT and SIOB.

The NMOS transistor N24 may be electrically coupled between the segment line SIOT and the local line LIOT, and may be applied with an input/output switch signal IOSW through the gate terminal thereof. The NMOS transistor N25 may be electrically coupled between the segment line SIOB and the local line LIOB, and may be applied with the input/output switch signal IOSW through the gate terminal thereof.

For example, a switching section (the NMOS transistors N24 and N25) may electrically couple or decouple the segment line pair SIOT and SIOB and the local line pair LIOT and LIOB in response to the input/output switch signal IOSW. In an embodiment, the switching section may allow the segment line pair SIOT and SIOB to be continuously electrically coupled with the local line pair LIOT and LIOB while the semiconductor device performs an active operation.

The local sense amplifier 200_2 may have a structure capable of separately performing a write operation and the read operation. For example, in the write operation for example, the local sense amplifier 200_2 electrically couples the segment line pair SIOT and SIOB and the local line pair LIOT and LIOB such that data transmission is implemented. In the read operation for example, the local sense amplifier 200_2 electrically decouples the segment line pair SIOT and SIOB and the local line pair LIOT and LIOB such that the differential amplified signals loaded on the segment line pair SIOT and SIOB are transmitted to the local line pair LIOT and LIOB.

The input/output sense amplifier 300_2 may include a precharge unit 350 and a sense amplifier 360.

The precharge unit 350 may precharge the local line pair LIOT and LIOB in response to a precharge signal LIOPCGB. The precharge unit 350 may provide the bit line precharge voltage VBLP to the local line pair LIOT and LIOB in response to, for example, the precharge signal LIOPCGB such that the local line pair LIOT and LIOB may be precharged to the level of the bit line precharge voltage VBLP.

For example, a precharge unit 350 may include a plurality of PMOS transistors P20 to P22. The PMOS transistors P20 to P22 may receive the precharge signal LIOPCGB through the common gate terminal thereof. The PMOS transistors P20 and P21 may be electrically coupled in series between the local line pair LIOT and LIOB. The PMOS transistors P20 and P21 may be applied with the bit line precharge voltage VBLP through the common drain terminal thereof. The PMOS transistor P22 may be electrically coupled between the local line pair LIOT and LIOB.

The precharge unit 350 may provide the bit line precharge voltage VBLP to the local line pair LIOT and LIOB when, for example, the precharge signal LIOPCGB is enabled, and may precharge the local line pair LIOT and LIOB.

The sense amplifier 360 may include an amplifying section and a switching section.

The amplifying section may include a plurality of NMOS transistors and PMOS transistors. For example, the amplifying section may include NMOS transistors N28 to N30 and PMOS transistors P23 to P25 to amplify the data loaded on the local line pair LIOT and LIOB. The switching section may include, for example, NMOS transistors N26 and N27 to electrically couple or decouple the local line pair LIOT and LIOB and an output line pair OUT and OUTB.

The NMOS transistor N28 may be an activation element electrically coupled between the common coupling terminal of the NMOS transistors N29 and N30 and the ground voltage terminal. The NMOS transistor N28 may be applied with an enable signal IOSAN through the gate terminal thereof. The enable signal IOSAN may be an activation signal allowing for the sense amplifier 360 to differentially amplify the local line pair LIOT and LIOB. The NMOS transistor N28 may be turned on by the enable signal IOSAN, and may allow current to be discharged to the ground voltage terminal.

The NMOS transistors N29 and N30 and the PMOS transistors P23 and P24 may be latches electrically coupled in a cross-coupled type. For example, the gate terminals of the NMOS transistor N29 and the PMOS transistor P23 may be commonly electrically coupled, and may be electrically coupled with the output line OUTB. The gate terminals of the NMOS transistor N30 and the PMOS transistor P24 may be commonly electrically coupled, and may be electrically coupled with the output line OUT.

The PMOS transistor P25 may be electrically coupled between the common coupling terminal of the PMOS transistors P23 and P24 and the application terminal of the core voltage VCORE. The PMOS transistor P25 may be applied with an enable signal IOSAP through the gate terminal thereof. The enable signal IOSAP may be an activation signal allowing the sense amplifier 360 to differentially amplify the local line pair LIOT and LIOB. The enable signals IOSAP and IOSAN may be signals having opposite phases. The PMOS transistor P25 may be an activation element turned on by the enable signal IOSAP and may supply the core voltage VCORE to the sense amplifier 360.

In the read operation for example, if the enable signals IOSAN and IOSAP are activated, the NMOS transistor N28 and the PMOS transistor P25 are turned on. The NMOS transistors N29 and N30 and the PMOS transistors P23 and P24 may latch and amplify the data of the local line pair LIOT and LIOB, and may output the latched and amplified data to the output line pair OUT and OUTB.

The NMOS transistor N26 may be electrically coupled between the local line LIOT and the output line OUT, and may be applied with an input/output switch signal LIOSW through the gate terminal thereof. The NMOS transistor N27 may be electrically coupled between the local line LIOB and the output line OUTB, and may be applied with the input/output switch signal LIOSW through the gate terminal thereof.

For example, a switching section (the NMOS transistors N26 and N27) may electrically couple or decouple the local line pair LIOT and LIOB and the output line pair OUT and OUTB in response to the input/output switch signal LIOSW. In an embodiment, the switching section may allow the local line pair LIOT and LIOB to be continuously electrically coupled with the output line pair OUT and OUTB while the semiconductor device performs an active operation.

The input/output sense amplifier 300_2 may have a structure capable of separately performing the write operation and the read operation. For example, in the read operation, the input/output sense amplifier 300_2 electrically decouples the local line pair LIOT and LIOB and the output line pair OUT and OUTB such that the amplified signals loaded on the local line pair LIOT and LIOB are transmitted to the output line pair OUT and OUTB.

One way of improving driving current may be to use the bit line precharge voltage VBLP instead of the core voltage VCORE, as precharge power for the precharge units 250 and 350. However, in the example where the bit line precharge voltage VBLP is used, a driving speed such has a tRCD (RAS to CAS delay time) characteristic and a tAA (address access delay time) characteristic may be degraded, when compared to the example where the core voltage VCORE is used.

In an embodiment, since the precharge units 250 and 350 are driven using the bit line precharge voltage VBLP having a relatively low voltage level, driving current (for example, IDD4R current) may be reduced. For example, the amplifying section of the input/output sense amplifier 300_2 may include the NMOS transistor N28 and the PMOS transistor P25 as driving elements. For example, by improving the structure of the amplifying section of the local sense amplifier 200_2, the driving capability and the speed of the amplifying section may be increased under low voltage circumstances. For example, in an embodiment, it may be possible to improve tRCD (RAS to CAS delay time) and tAA (address access delay time) characteristics while reducing driving current.

Figure 5:
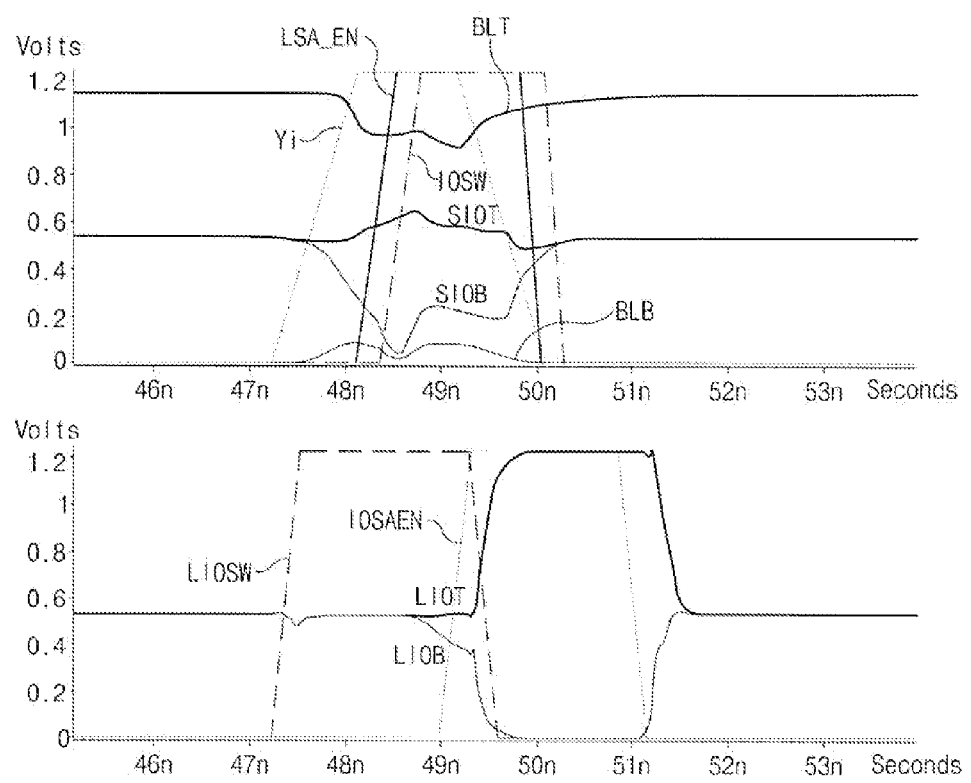
FIG. 5 is a representation of an example of a signal waveform diagram of the sense amplifiers in accordance with an embodiment.

FIG. 5 is a representation of an example of a signal waveform diagram of the sense amplifiers in accordance with an embodiment. In an embodiment, the operation processes of the sense amplifiers according to the examples of FIG. 2 will be described as an example.

For example, where the precharge signal SIOPCGB is in an activated state, the precharged states of the segment line pair SIOT and SIOB are retained by the precharge unit 210.

The data amplified by the bit line sense amplifier 100 are transferred from the bit line pair BLT and BLB to the segment line pair SIOT and SIOB as the column select signal Yi is enabled. Then, by the amplifying operation of the local sense amplifier 200, the data of the segment line pair SIOT and SIOB are started to be differentially amplified.

Thereafter, the local sense amplifier 200 becomes an activated state when the enable signal LSA_EN transitions to a high level. If the input/output switch signal IOSW transitions to a high level, the switching section (the NMOS transistors N4 and N5) is turned on. Accordingly, the segment line pair SIOT and SIOB and the local line pair LIOT and LIOB are electrically coupled.

Next, if the column select signal Yi is deactivated, the electrical coupling between the bit line sense amplifier 100 and the local sense amplifier 200 is blocked. If the enable signal LSA_EN transitions to a low level, the local sense amplifier 200 transitions to a deactivated state.

If the input/output switch signal IOSW transitions to a low level, the switching section (the NMOS transistors N4 and N5) is turned off. Accordingly, the electrical coupling of the segment line pair SIOT and SIOB and the local line pair LIOT and LIOB is blocked.

In the example where the precharge signal LIOPCGB is in an activated state, the precharged states of the local line pair LIOT and LIOB are retained by the precharge unit 310. Then, if the input/output switch signal LIOSW transitions to a high level, the switching section (the NMOS transistors N6 and N7) is turned on. The data of the local line pair LIOT and LIOB are transferred to the sense amplifier 320.

If the enable signal IOSAEN is activated, the amplifying section of the sense amplifier 320 amplifies the data loaded on the local line pair LIOT and LIOB, and outputs the amplified data to the output line pair OUT and OUTB. As the input/output switch signal LIOSW transitions to a low level, the electrical coupling of the local line pair LIOT and LIOB and the output line pair OUT and OUTB is blocked.

As is apparent from the above descriptions, according to the various embodiments, the structure of a sense amplifier may be improved, whereby an offset characteristic and a read operation speed may be improved and current consumption may be reduced.

Figure 6:
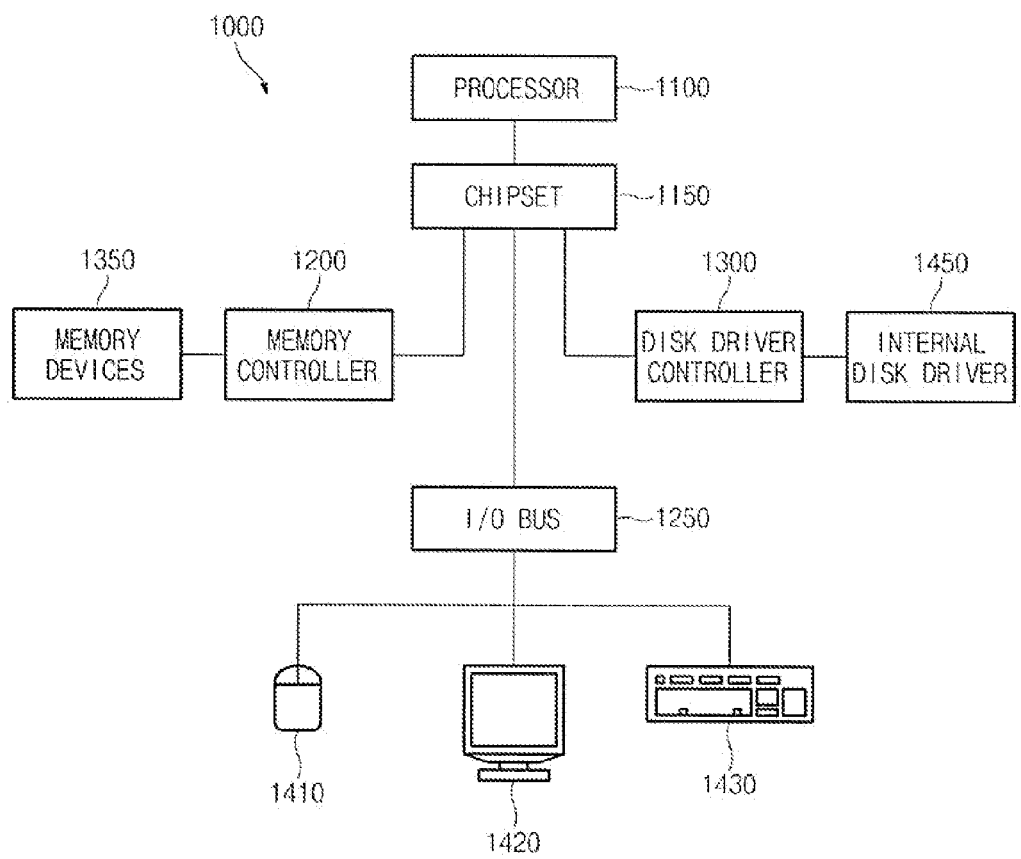
FIG. 6 illustrates a block diagram of an example of a representation of a system employing a sense amplifier and/or semiconductor device in accordance with the various embodiments discussed above with relation to FIGS. 1-5.

The sense amplifier and/or semiconductor device discussed above (see FIGS. 1-5) are particular useful in the design of memory devices, processors, and computer systems. For example, referring to FIG. 6, a block diagram of a system employing the sense amplifier and/or semiconductor device in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one sense amplifier and/or semiconductor device as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one sense amplifier and/or semiconductor device as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1300 may also be operably coupled to the chipset 1150. The disk drive controller 1300 may serve as the communication pathway between the chipset 1150 and one or more internal disk drivers 1450. The internal disk driver 1450 may facilitate disconnection of the external data storage devices by storing both instructions and data. The disk drive controller 1300 and the internal disk drivers 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the sense amplifier and/or semiconductor device as discussed above with relation to FIGS. 1-5. In alternate embodiments, such as cellular phones or digital cameras, the components may differ from the embodiments illustrated in FIG. 6.

While various embodiments have been described above, it will be understood to those skilled in the art that the embodiments described are by way of example only. Accordingly, the sense amplifier and the semiconductor device including the same described herein should not be limited based on the described embodiments.

What is claimed is:

1. A sense amplifier comprising:
   a segment line pair configured to selectively electrically couple a bit line pair in response to a column select signal;
   an amplifying section configured to amplify data of the segment line pair when an enable signal is activated and output amplified data to a local line pair, and including latches electrically coupled in a cross-coupled type; and
   a switching section configured to selectively electrically couple the segment line pair and the local line pair in response to an input/output switch signal, wherein the switching section is configured to transfer a data outputted from the amplifying section to the local line pair.

2. The sense amplifier according to claim 1, wherein the amplifying section comprises:
   an activation element configured to activate the amplifying section when the enable signal is activated; and
   the latches configured to amplify the data of the segment line pair.

3. The sense amplifier according to claim 2,
   wherein the activation element comprises a first NMOS transistor electrically coupled between the latches and a ground voltage terminal, and
   wherein a gate terminal of the first NMOS transistor is configured to receive the enable signal.

4. The sense amplifier according to claim 2, wherein the latches comprise:
   a second NMOS transistor electrically coupled between a second segment line and the activation element, and having a gate terminal electrically coupled with a first segment line; and
   a third NMOS transistor electrically coupled between the first segment line and the activation element, and having a gate terminal electrically coupled with the second segment line.

5. The sense amplifier according to claim 1, wherein the switching section comprises:
   a fourth NMOS transistor electrically coupled between the first segment line and a first local line, and having a gate terminal configured for receiving the input/output switch signal; and
   a fifth NMOS transistor electrically coupled between the second segment line and a second local line, and having a gate terminal configured for receiving the input/output switch signal.

6. The sense amplifier according to claim 1, further comprising:
   a precharge unit configured to precharge the segment line pair to a level of a core voltage when a precharge signal is activated.

7. The sense amplifier according to claim 1, further comprising:
   a precharge unit configured to precharge the segment line pair to a level of a bit line precharge voltage when a precharge signal is activated.

8. A sense amplifier configured for amplifying data of a local line pair and outputting amplified data to an output line pair when an enable signal is activated, the sense amplifier comprising:
   a switching section configured to transfer a data outputted from a segment line pair to the local line pair;
   an activation element configured to activate the sense amplifier in response to the enable signal;
   a pair of transistors configured to be driven by the local line pair; and latches configured to amplify the data of the local line pair in response to driving of the pair of transistors, and output the amplified data to the output line pair.

9. The sense amplifier according to claim 8,
wherein the activation element comprises a first NMOS transistor electrically coupled between the pair of transistors and a ground voltage terminal and
wherein a gate terminal of the first NMOS transistor is configured to receive the enable signal.

10. The sense amplifier according to claim 8, wherein the pair of transistors comprise a second NMOS transistor and a third NMOS transistor electrically coupled between the activation element and the latches, and the second NMOS transistor and the third NMOS transistor are selectively turned on by the local line pair.

11. The sense amplifier according to claim 8,
wherein the latches comprise a fourth NMOS transistor, a fifth NMOS transistor, a first PMOS transistor and a second PMOS transistor electrically coupled between the pair of transistors and the ground voltage terminal in a cross-coupled type and
wherein gate terminals of the fourth NMOS transistor, the fifth NMOS transistor, the first PMOS transistor and the second PMOS transistor are commonly electrically coupled.

12. The sense amplifier according to claim 8, further comprising:
a precharge unit configured to precharge the local line pair to a level of a core voltage when a precharge signal is activated.

13. A sense amplifier comprising:
a local line pair;
an amplifying section configured to amplify data of the local line pair when an enable signal is activated and output amplified data to an output line pair, and including latches electrically coupled in a cross-coupled type; and
a switching section configured to selectively electrically couple the local line pair and the output line pair in response to an input/output switch signal, wherein the switching section is configured to transfer a data outputted from the local line pair to the amplifying section.

14. The sense amplifier according to claim 13, wherein the amplifying section comprises:
a first activation element configured to activate the amplifying section in response to the enable signal;
a second activation element configured to supply a power supply voltage to the amplifying section in response to the enable signal; and
a first NMOS transistor, a second NMOS transistor, a first PMOS transistor and a second PMOS transistor electrically coupled in the cross-coupled type, having gate terminals commonly electrically coupled, and configured to amplify the data of the local line pair.

15. The sense amplifier according to claim 14,
wherein the first activation element comprises a third NMOS transistor electrically coupled between the first NMOS transistor and the second NMOS transistor and a ground voltage terminal, and
wherein a gate terminal of the third NMOS transistor is configured to receive the enable signal.

16. The sense amplifier according to claim 14, wherein the second activation element comprises a third PMOS transistor electrically coupled between the first PMOS transistor and the second PMOS transistor and a power supply voltage terminal, and
wherein a gate terminal of the third PMOS transistor is configured to receive an inverted signal of the enable signal.

17. The sense amplifier according to claim 13, further comprising:
a precharge unit configured to precharge the local line pair to a level of a bit line precharge voltage when a precharge signal is activated.

18. A semiconductor device comprising:
a local sense amplifier configured to amplify data of a segment line pair when a first enable signal is activated and output amplified data to a local line pair, and including latches electrically coupled in a cross-coupled type;
a switching section configured to selectively electrically couple the segment line pair and the local line pair in response to an input/output switch signal; and
an input/output sense amplifier configured to amplify data of the local line pair when a second enable signal is activated and output amplified data to an output line pair,
wherein the switching section is configured to transfer a data outputted from the local sense amplifier to the local line pair.

19. The semiconductor device according to claim 18, wherein the local sense amplifier comprises:
a first NMOS transistor electrically coupled between ground voltage terminals, and a gate terminal of the first NMOS transistor is configured to receive the first enable signal;
a second NMOS transistor electrically coupled between a second segment line and the first NMOS transistor, and having a gate terminal electrically coupled with a first segment line; and
a third NMOS transistor electrically coupled between the first segment line and the first NMOS transistor, and having a gate terminal electrically coupled with the second segment line.

20. The semiconductor device according to claim 18, wherein the switching section comprises:
a fourth NMOS transistor electrically coupled between the first segment line and a first local line, and a gate terminal of the fourth NMOS transistor configured for receiving the input/output switch signal; and
a fifth NMOS transistor electrically coupled between the second segment line and a second local line, and a gate terminal of the fifth NMOS transistor configured for receiving the input/output switch signal.

* * * * *